United States Patent
Whatcott

(10) Patent No.: US 10,109,938 B2
(45) Date of Patent: Oct. 23, 2018

(54) FLEX CIRCUIT CONNECTOR CONFIGURATION

(71) Applicant: Rosemount Aerospace Inc., Burnsville, MN (US)

(72) Inventor: Neal R. Whatcott, Carver, MN (US)

(73) Assignee: Rosemount Aerospace, Inc., Burnsville, MN (US)

( * ) Notice: Subject to any disclaimer, the term of this patent is extended or adjusted under 35 U.S.C. 154(b) by 65 days.

(21) Appl. No.: 15/071,737

(22) Filed: Mar. 16, 2016

(65) Prior Publication Data

US 2017/0271791 A1    Sep. 21, 2017

(51) Int. Cl.
| | |
|---|---|
| H05K 1/00 | (2006.01) |
| H01R 12/62 | (2011.01) |
| H05K 1/14 | (2006.01) |
| H05K 1/02 | (2006.01) |

(52) U.S. Cl.
CPC .......... *H01R 12/62* (2013.01); *H05K 1/028* (2013.01); *H05K 1/14* (2013.01); *H05K 1/147* (2013.01); *H05K 2201/09263* (2013.01)

(58) Field of Classification Search
CPC ..................................................... G10F 23/00
USPC ................ 361/749–750, 803, 767, 787–789; 174/254–262
See application file for complete search history.

(56) References Cited

U.S. PATENT DOCUMENTS

| | | | |
|---|---|---|---|
| 4,845,315 A | 7/1989 | Stopper | |
| 4,862,153 A * | 8/1989 | Nakatani | G02F 1/13452 313/511 |
| 5,573,428 A | 11/1996 | Biggs et al. | |
| 6,769,920 B1 * | 8/2004 | Mease | G06F 1/18 439/493 |
| 7,442,073 B2 | 10/2008 | Black et al. | |
| 8,215,237 B2 | 7/2012 | Geswender | |
| 8,559,191 B2 | 10/2013 | Porter et al. | |
| 8,635,937 B2 | 1/2014 | Angeloff et al. | |
| 8,942,005 B2 | 1/2015 | Geswender | |
| 2003/0221861 A1 | 12/2003 | Dupriest | |
| 2007/0252748 A1 * | 11/2007 | Rees | H01Q 1/28 342/29 |

(Continued)

FOREIGN PATENT DOCUMENTS

| | | |
|---|---|---|
| EP | 2503860 A1 | 9/2012 |
| GB | 2034102 A | 5/1980 |

(Continued)

OTHER PUBLICATIONS

Extended European Search Report for EP Application No. 17159684.4, dated Jun. 22, 2017, 8 pages.

(Continued)

*Primary Examiner* — Tuan T Dinh
(74) *Attorney, Agent, or Firm* — Kinney & Lange, P.A.

(57) ABSTRACT

An electronic system of a device includes first and second circuit boards and a flexible connector configured to electrically connect the first and second circuit boards. The flexible connector includes a serpentine portion that includes first, second and third legs. The first leg that extends in a first direction, the second leg extends in a second direction opposite of the first direction, and the third leg extends in the first direction. The first, second and third legs are configured in a common plane when the device is in an operational state.

9 Claims, 3 Drawing Sheets

(56) References Cited

U.S. PATENT DOCUMENTS

2009/0266573 A1   10/2009  Engmark et al.
2012/0242364 A1*  9/2012  Ohmayer ................ G01F 23/00
                                                    324/756.05
2015/0054600 A1*  2/2015  Sasaki ..................... H01P 3/085
                                                      333/238
2016/0372851 A1*  12/2016  Beck ...................... H01R 12/62

FOREIGN PATENT DOCUMENTS

WO           2015175039 A2   11/2015
WO    WO 2015182348 A1   12/2015

OTHER PUBLICATIONS

Extended European Search Report for Application No. 17159684.4, dated Jul. 16, 2018, 6 pages.

* cited by examiner

FLEX CIRCUIT CONNECTOR CONFIGURATION

BACKGROUND

The present invention relates generally to electronic circuits, and in particular to flex circuit connector configurations.

In airborne devices, such as guided projectiles, the devices may include multiple electronic subsystems. These subsystems often need to communicate with one another electronically. The wires utilized to interconnect these subsystems must be long enough to connect the subsystems when the device is both assembled and disassembled. For example, when servicing a device, two parts of the device may be detached and pulled apart from one another to allow a technician access to the internal components of the device. The wires must be long enough to accommodate detachment of the two parts without causing undue stress on the wires or the components they are connected to.

In prior art devices, wire harnesses were implemented to connect circuit boards of the various subsystems. These harnesses were folded back and forth upon themselves and stuffed within an open compartment of the device. These folds of the harness can cause undue stress upon the wires, especially in devices such as guided projectiles that experience high g-forces during operation. Folding the wire harnesses back and forth upon themselves also takes up space within the device that could be utilized for other purposes. It is desirable to implement a more efficient and effective method for interconnecting internal subsystems of devices.

SUMMARY

A flexible circuit connector for connecting first and second circuit boards of a device includes first and second connectors and a middle portion. The first connector is configured to connect to the first circuit board. The second connector is configured to connect to the second circuit board. The middle portion is configured between the first and second connectors and includes a serpentine portion. The serpentine portion includes first and second legs. The first leg extends toward the second connector to a first turn and the second leg extends from the first turn toward the first connector to a second turn. The first and second legs are configured in a common plane when the device is in an operational state.

An electronic system of a device includes first and second circuit boards and a flexible connector configured to electrically connect the first and second circuit boards. The flexible connector includes a serpentine portion that includes first, second and third legs. The first leg that extends in a first direction, the second leg extends in a second direction opposite of the first direction, and the third leg extends in the first direction. The first, second and third legs are configured in a common plane when the device is in an operational state.

DETAILED DESCRIPTION

A flex connecter is disclosed herein that includes a serpentine portion for connecting multiple subsystems of a device. The flex connector is configured to reduce stress applied to the connector while the device is in an operational state while also allowing easy access for maintenance while the device is in a disassembled state. The connector is connected between two circuit boards. The serpentine portion connects first and second connector portions of the flex connector. The serpentine portion includes three legs configured in a common plane while the device is in an operational state. The first leg extends toward the second connector, the second leg extends back toward the first connector in an opposite direction to that of the first leg, and the third leg extends toward, and connects to, the second connector. When the device is disassembled (e.g., two portions of the device are pulled apart from one another), the serpentine portion allows the circuit boards to remain connected without creating any undue stress on either the flex connector or any of the components of the device.

Figure 1:
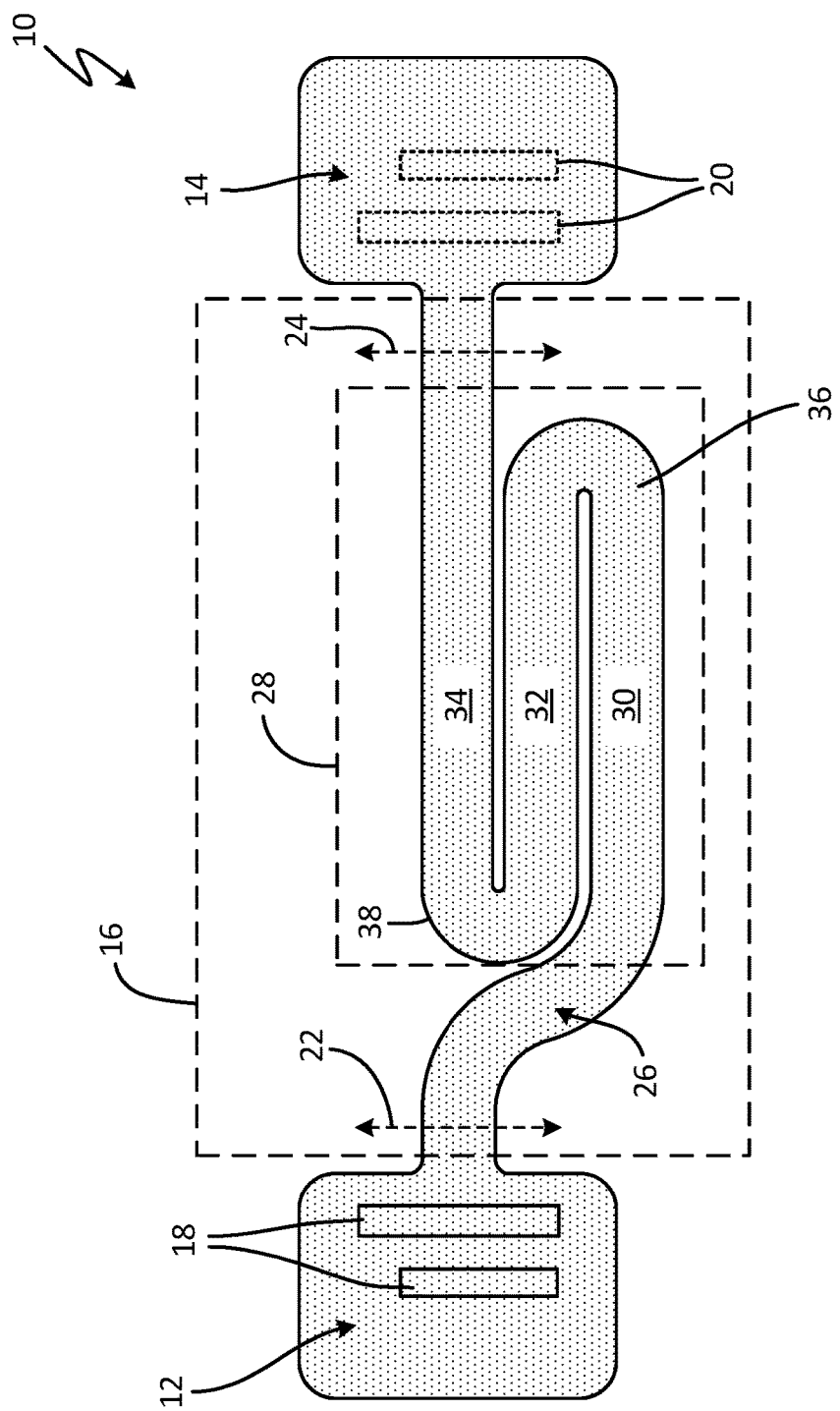
FIG. 1 is a diagram illustrating a configuration of a flex connector for use in connecting multiple electronic systems.

FIG. 1 is a diagram illustrating a configuration of flex connector 10 that includes connector portions 12 and 14 and middle portion 16. Connector portion 12 includes topside connectors 18 and connector portion 14 includes underside connectors 20. Middle portion 16 includes bend points 22 and 24, curved portion 26 and serpentine portion 28. Serpentine portion 28 includes legs 30, 32 and 34, and turns 36 and 38. While illustrated in FIG. 1 as topside connectors 18 and underside connectors 20, connectors 18 and 20 may be implemented on either surface of connector portions 12 and 14 depending on the configuration of the electronic systems for which flex connector 10 is configured to connect.

Bend points 22 and 24 are designated points on middle portion 16 at which flex connector 10 will bend while in an operational state. For example, a device may have circuit boards that are substantially parallel to one another while the device is the operational state. In this embodiment, bend points 22 and 24 are the designated points of flex connector 10 that will provide a 90° gradual bend, for example, to facilitate connection of connectors 18 and 20 to the circuit boards. Bend points 22 and 24 may be the only points of flex connector 10 that are bent during an operational state of the device. This reduces the overall stress placed upon flex connector 10 while the device is operational.

Serpentine portion 28 allows connector portions 14 and 16 to move apart and away from one another without causing any undue stress on flex connector 10. Curved portion 26 connects bend point 22 to leg 30 such that leg 30 is axially offset from bend point 22. In the embodiment illustrated in FIG. 1, curved portion 26 includes two rounded 90° turns, but in other embodiments may be any curve that allows connection of bend point 22 to leg 30 such that leg 30 is axially offset from bend point 22. In other embodiments, curved portion 26 may instead be implemented to connect leg 34 to bend point 24 such that bend point 24 is axially offset from leg 34. In yet another embodiment, multiple curved portions may be implemented such that leg 30 is axially offset from bend point 22 and leg 34 is axially offset from bend point 24.

In the embodiment illustrated in FIG. 1, legs 30, 32 and 34 exist in substantially the same plane and are substantially parallel to one another. Leg 30 extends towards connector portion 14 to turn 36. Turn 36 may be a rounded 180° turn that connects leg 30 to leg 32 such that legs 30 and 32 are substantially parallel. Leg 32 extends back toward connector portion 12 to turn 38. Turn 38 may be a 180° turn that connects leg 32 to leg 34 such that leg 32 is substantially parallel to leg 34. Leg 34 extends back toward connector portion 14 to bend point 24. Because of curved portion 26, leg 34 is axially aligned with bend point 24. Bend point 24 connects middle portion 16 to connector portion 14.

Flex connector 10 may be implemented as any type of flexible electronics, for example, such as electronic circuits mounted on flexible plastic substrates. Connector portions 12 and 14 of flex connector 10 may be implemented as either flexible electronics, or as rigid printed circuit boards, for example. Flex connector 10 may include only electrical interconnections between connectors 18 and 20, or may include other electronic circuit components, for example. To accommodate a greater number of electrical interconnections, flex connector 10 may also include more than one layer. For example, several flex connectors 10, each including their own respective electronic interconnections, may be connected to common connectors 18 and 20 to provide a greater number of electrical interconnections between connectors 18 and 20.

Figure 2:
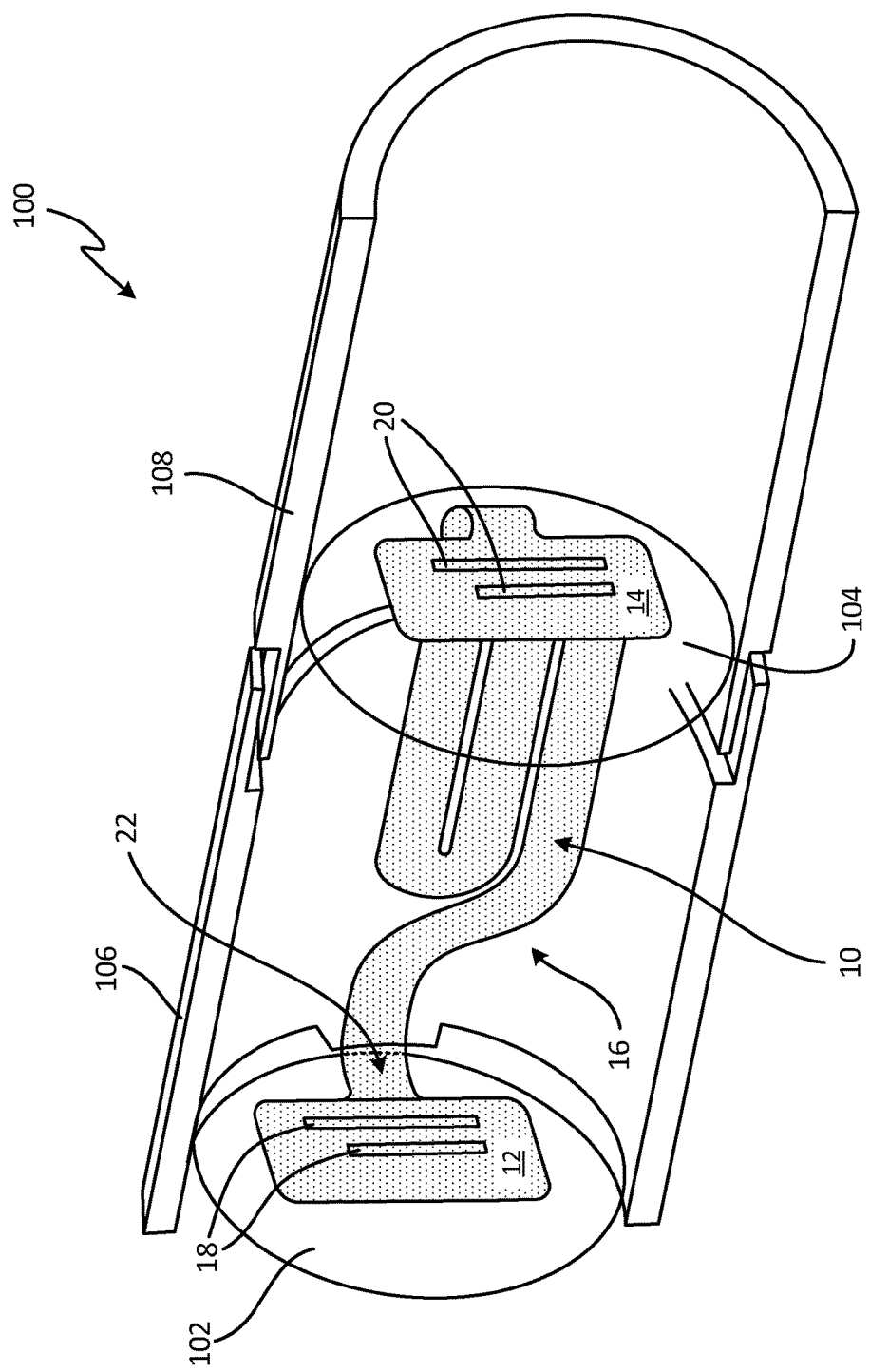
FIG. 2 is a diagram illustrating a device in an operational state that includes circuit boards connected by a flex connector.

FIG. 2 is a diagram illustrating device 100 in an operational state that includes circuit boards 102 and 104 connected by flex connector 10. Device 100 may include compartments 106 and 108. Circuit board 102 may be positioned within compartment 106 and circuit board 104 may be positioned within compartment 108. Device 100 is any device in which electronic circuits must connect to one another such as, for example, airborne munitions.

Connector 18 may be connected to circuit board 102 and connector 20 may be connected to circuit board 104. In the operational state illustrated in FIG. 2, connector portions 12 and 14 are substantially parallel to one another due to the parallel configurations of circuit boards 102 and 104. Middle portion 16 extends along an inside surface across both compartments 106 and 108. While illustrated as connecting to circuit board 102 utilizing topside connectors, connector portion 12 may be configured to connect to either side of circuit board 102. Bend point 22 bends gradually around circuit board 102 through an opening between circuit board 102 and an inside surface of compartment 106 such that minimal stress is placed upon flex connector 10. While illustrated as connecting to circuit board 104 using underside connectors, connector portion 14 may be configured to connect to either side of circuit board 104.

Middle portion 16 may be perpendicular to circuit boards 102 and 104 and may run along an inside surface of device 100. Because middle portion 16 exists in a single plane, flex connector 10 takes up minimal space within device 100 while device 100 is in an operational state. Additionally, in high stress environments, such as that of an airborne munition, middle portion 16 being in a single plane minimizes the stress placed upon flex connector 10 due to g-forces experienced by device 100. In prior art systems, electrical connectors between circuit boards 102 and 104 were folded back and forth upon themselves during operational states of device 100. These folds can cause unwanted stress for the electrical connector, which can be exacerbated in high g-force environments. By utilizing flex connector 10, stresses experienced by the electrical connectors during operational states can be minimized. While illustrated as free within compartments 106 and 108, a physical channel may also be implemented within compartments 106 and 108 through which middle portion 16 may run. This would separate flex connector 10 from other internal components, further reducing the stress placed upon flex connector 10 during operation of device 100.

Figure 3:
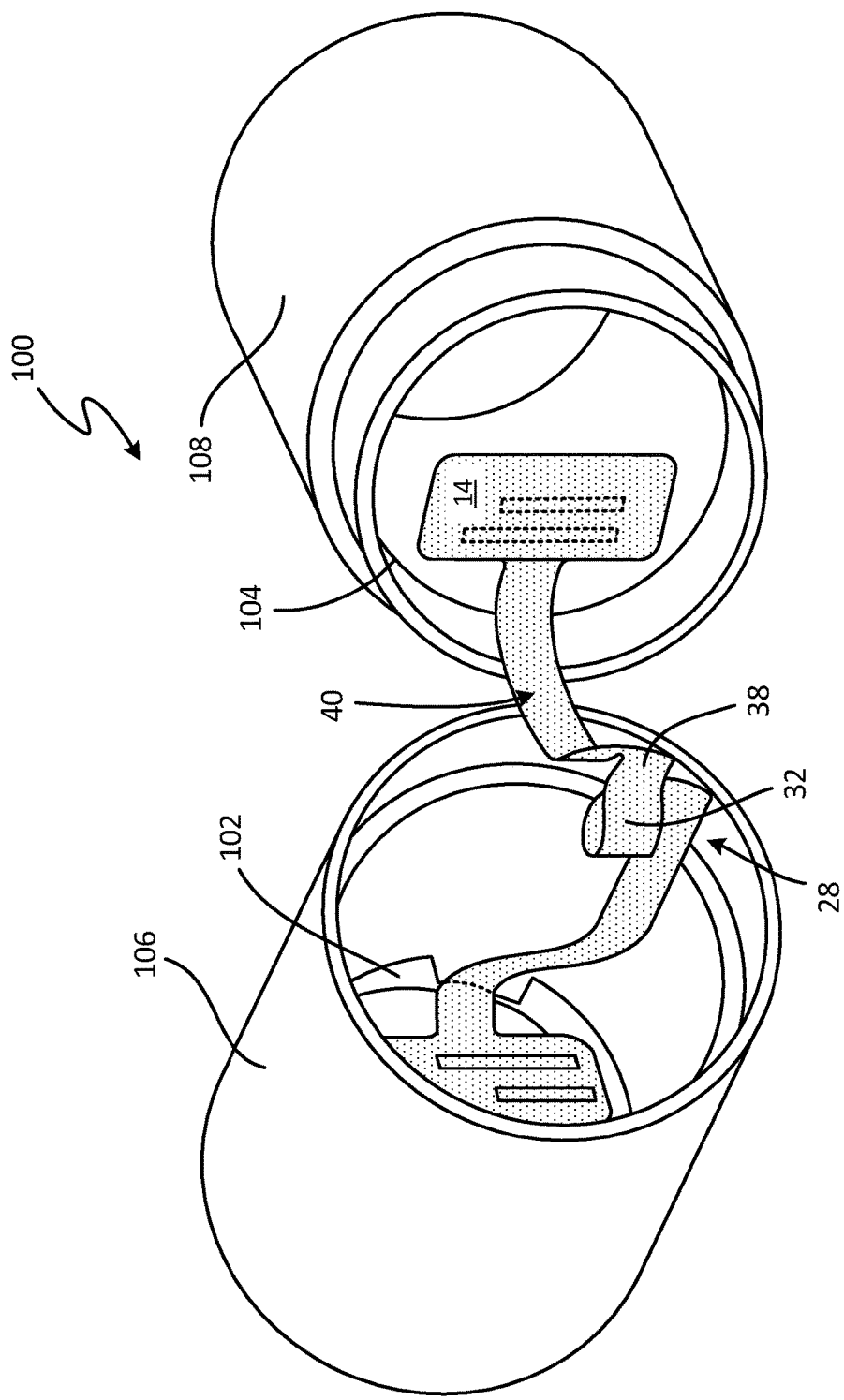
FIG. 3 is a diagram illustrating a device in a disassembled state that includes circuit boards connected by a flex connector.

FIG. 3 is a diagram illustrating device 100 in a disassembled state. In the embodiment illustrated in FIG. 3, compartments 106 and 108 are detached and pulled apart at 90° with flex connecter 10 continuing to connect circuit boards 102 and 104. This provides ease of access to internal components while performing maintenance, for example, without the need for disconnection of circuit boards 102 and 104 and without undue stress placed upon flex connector 10.

As seen in FIG. 3, serpentine portion 28 allows connector portions 12 and 14 to pull apart and away from one another. As connector portion 14 is pulled away from connector portion 12, leg 32 and turn 38 are pulled out of the common plane of serpentine portion 28 and away from connector portion 12. Connector portion 14 pulls leg 34, which pulls turn 38 out of the common plane of serpentine portion 28 and toward connector portion 14. As turn 38 is pulled toward connector portion 14, leg 32 gradually bends, allowing turn 38 to move further toward connector portion 14 without creating undue stress upon flex connector 10. As illustrated in FIG. 3, this allows compartments 106 and 108 to be fully disconnected and pulled apart at a full 90° or greater.

Discussion of Possible Embodiments

The following are non-exclusive descriptions of possible embodiments of the present invention.

A flexible circuit connector for connecting first and second circuit boards of a device includes first and second connectors and a middle portion. The first connector is configured to connect to the first circuit board. The second connector is configured to connect to the second circuit board. The middle portion is configured between the first and second connectors and includes a serpentine portion. The serpentine portion includes first and second legs. The first leg extends toward the second connector to a first turn and the second leg extends from the first turn toward the first connector to a second turn. The first and second legs are configured in a common plane when the device is in an operational state.

The flexible circuit connector of the preceding paragraph can optionally include, additionally and/or alternatively, any one or more of the following features, configurations, operations, and/or additional components:

A further embodiment of the foregoing connector, wherein the serpentine portion further includes a third leg that extends from the second turn toward the second connector, wherein the third leg is configured in the common plane with the first and second legs when the device is in the operational state.

A further embodiment of any of the foregoing connectors, wherein the middle portion further includes a first end connected to the first connector at a first bend point, wherein the flexible circuit connector is configured to bend at the first bend point in the operational state; and a second end connected to the second connector at a second bend point, wherein the flexible circuit connector is configured to bend at the second bend point in the operational state.

A further embodiment of any of the foregoing connectors, wherein the first circuit board is configured parallel to the second circuit board when the device is in the operational state.

A further embodiment of any of the foregoing connectors, wherein the middle portion is configured perpendicular to the first and second circuit boards when the device is in the operational state.

A further embodiment of any of the foregoing connectors, wherein the serpentine portion further includes a curved portion configured to connect the first end of the middle portion to the first leg such that the first leg is axially offset from the first bend point.

A further embodiment of any of the foregoing connectors, wherein the curved portion comprises third and fourth turns, wherein the third and fourth turns are each ninety degree turns.

A further embodiment of any of the foregoing connectors, wherein the third leg is axially aligned with both the first and second bend points.

A further embodiment of any of the foregoing connectors, wherein the first and second turns are configured to turn one hundred eighty degrees, and the first, second and third legs of the serpentine portion are parallel to one another.

An electronic system of a device includes first and second circuit boards and a flexible connector configured to electrically connect the first and second circuit boards. The flexible connector includes a serpentine portion that includes first, second and third legs. The first leg that extends in a first direction, the second leg extends in a second direction opposite of the first direction, and the third leg extends in the first direction. The first, second and third legs are configured in a common plane when the device is in an operational state.

The electronic system of the preceding paragraph can optionally include, additionally and/or alternatively, any one or more of the following features, configurations, operations, and/or additional components:

A further embodiment of the foregoing system, wherein flexible connector further includes first and second connecters, wherein the first connector connects the flexible connector to the first circuit board, and wherein the second connector connects the flexible connector to the second circuit board, and wherein the serpentine portion is connected between the first and second connectors.

A further embodiment of any of the foregoing systems, wherein the serpentine portion further comprises a first turn that connects the first leg and the second leg, and a second turn that connects the second leg to the third leg.

A further embodiment of any of the foregoing systems, wherein the first and second turns are one hundred eighty degree turns.

A further embodiment of any of the foregoing systems, wherein the flexible connector further includes a first bend point between the first connector and the serpentine portion, wherein the flexible connector is configured to bend at the first bend point when the device is in the operational state; and a second bend point between the second connector and the serpentine portion, wherein the flexible connector is configured to bend at the second bend point when the device is in the operational state.

A further embodiment of any of the foregoing systems, wherein the first circuit board is configured parallel to the second circuit board when the device is in the operational state.

A further embodiment of any of the foregoing systems, wherein the serpentine portion is configured perpendicular to the first and second circuit boards when the device is in the operational state.

A further embodiment of any of the foregoing systems, wherein the serpentine portion further comprises a curved portion configured to connect the first bend point to the serpentine portion such that the first leg of the serpentine portion is axially offset from the first bend point.

A further embodiment of any of the foregoing systems, wherein the curved portion comprises third and fourth turns, wherein the third and fourth turns are each ninety degree turns.

A further embodiment of any of the foregoing systems, wherein the third leg of the serpentine portion is axially aligned with both the first and second bend points.

A further embodiment of any of the foregoing systems, wherein the first, second and third legs of the serpentine portion are parallel to one another.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A flexible circuit connector for connecting first and second circuit boards of an airborne device, the flexible circuit connector comprising:
    a first connector that connects to the first circuit board;
    a second connector that connects to the second circuit board, wherein the first circuit board is positioned parallel to the second circuit board when the airborne device is in an operational state;
    a middle portion positioned between the first and second connectors, the middle portion comprising:
        a first end connected to the first connector at a first bend point, wherein the flexible circuit connector bends at the first bend point in the operational state;
        a second end connected to the second connector at a second bend point, wherein the flexible circuit connector bends at the second bend point in the operational state, and wherein the middle portion is perpendicular to the first and second circuit boards in the operational state; and
    a serpentine portion, wherein the serpentine portion comprises:
        a first leg that extends toward the second connector to a first turn;
        a second leg that extends from the first turn toward the first connector to a second turn;
        a third leg that extends from the second turn toward the second connector, wherein the third leg is axially aligned with both the first and second bend points; and
        wherein the first, second, and third legs are in a common plane when the airborne device is in the operational state.

2. The flexible circuit connector of claim 1, wherein the serpentine portion further comprises a curved portion connecting the first end of the middle portion to the first leg such that the first leg is axially offset from the first bend point.

3. The flexible circuit connector of claim 1, wherein the first and second turns turn one hundred eighty degrees, and the first, second, and third legs of the serpentine portion are parallel to one another.

4. The flexible circuit connector of claim 2, wherein the curved portion comprises third and fourth turns, wherein the third and fourth turns are each ninety degree turns.

5. An electronic system of an airborne device, the electronic system comprising:
- a first circuit board;
- a second circuit board, wherein the first circuit board is positioned parallel to the second circuit board when the airborne device is in an operational state; and
- a flexible connector electrically connecting the first and second circuit boards, the flexible connector comprising:
  - a first connector that connects the flexible connector to the first circuit board;
  - a second connector that connects the flexible connector to the second circuit board;
  - a middle portion positioned between the first and second connectors, the middle portion comprising:
    - a first end connected to the first connector at a first bend point, wherein the flexible connector bends at the first bend point in the operational state;
    - a second end connected to the second connector at a second bend point, wherein the flexible connector bends at the second bend point in the operational state, and wherein the middle portion is perpendicular to the first and second circuits boards when the airborne device is in the operational state; and
    - a serpentine portion, wherein the serpentine portion comprises:
      - a first leg that extends in a first direction;
      - a second leg that extends in a second direction opposite of the first direction;
      - a third leg that extends in the first direction, wherein the third leg is axially aligned with both the first and second bend points; and
      - wherein the first, second, and third legs are in a common plane when the airborne device is in the operational state.

6. The electronic system of claim 5, wherein the serpentine portion further comprises a first turn that connects the first leg and the second leg, and a second turn that connects the second leg to the third leg.

7. The electronic system of claim 6, wherein the first and second turns are one hundred eighty degree turns.

8. The electronic system of claim 6, wherein the serpentine portion further comprises a curved portion connecting the first bend point to the serpentine portion such that the first leg of the serpentine portion is axially offset from the first bend point.

9. The electronic system of claim 8, wherein the curved portion comprises third and fourth turns, wherein the third and fourth turns are each ninety degree turns.

* * * * *